(12) United States Patent
Wu et al.

(10) Patent No.: US 8,106,423 B2
(45) Date of Patent: Jan. 31, 2012

(54) METHOD AND STRUCTURE USING A PURE SILICON DIOXIDE HARDMASK FOR GATE PATTERNING FOR STRAINED SILICON MOS TRANSISTORS

(75) Inventors: Hanming Wu, Shanghai (CN); Jiang Zhang, Shanghai (CN); John Chen, Shanghai (CN); Xian J. Ning, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 43 days.

(21) Appl. No.: 12/145,268

(22) Filed: Jun. 24, 2008

(65) Prior Publication Data

US 2009/0065805 A1 Mar. 12, 2009

Related U.S. Application Data

(63) Continuation of application No. 11/245,412, filed on Oct. 5, 2005, now Pat. No. 7,425,488.

(30) Foreign Application Priority Data

Sep. 19, 2005 (CN) .......................... 2005 1 0029993

(51) Int. Cl.
*H01L 29/66* (2006.01)

(52) U.S. Cl. .......................................... 257/192; 257/77

(58) Field of Classification Search .................. 257/192, 257/77

See application file for complete search history.

(56) References Cited

U.S. PATENT DOCUMENTS

| | | | |
|---|---|---|---|
| 6,080,607 A | 6/2000 | Chang et al. | |
| 6,436,229 B2 * | 8/2002 | Tai et al. | 156/345.18 |
| 6,657,276 B1 | 12/2003 | Karlsson et al. | |
| 7,425,488 B2 | 9/2008 | Wu et al. | |
| 2003/0164534 A1 * | 9/2003 | Urakami et al. | 257/627 |
| 2004/0173815 A1 | 9/2004 | Yeo et al. | |
| 2005/0035409 A1 | 2/2005 | Ko et al. | |
| 2005/0280004 A1 * | 12/2005 | Das et al. | 257/77 |
| 2006/0154477 A1 | 7/2006 | Geng et al. | |
| 2007/0077716 A1 | 4/2007 | Chen et al. | |

OTHER PUBLICATIONS

Final Office Action for U.S. Appl. No. 11/245,412, mailed on Oct. 10, 2007, 13 pages.
Non-Final Office Action for U.S. Appl. No. 11/245,412, mailed on Apr. 25, 2007, 15 pages.
Notice of Allowance for U.S. Appl. No. 11/245,412, mailed on May 15, 2008, 11 pages.
Requirement for Restriction/Election for U.S. Appl. No. 11/245,412, mailed on Mar. 19, 2007, 5 pages.

* cited by examiner

*Primary Examiner* — Kenneth Parker
*Assistant Examiner* — Anthony Ho
(74) *Attorney, Agent, or Firm* — Kilpatrick Townsend & Stockton LLP

(57) ABSTRACT

A structure using pure silicon dioxide hard marsk for gate pattern. In an embodiment, the present invention provides a partially completed semiconductor integrated circuit device. The device has a semiconductor substrate and a dielectric layer overlying the semiconductor substrate. The device has a gate structure including edges and a substantially pure silicon dioxide mask structure overlying the gate structure. A thickness ranging from about 400 to about 600 Angstroms of the substantially pure silicon dioxide mask structure is included. The device has a dielectric layer forming sidewall spacers on the edges of the gate structure to protect the gate structure including the edges and an exposed portion of the pure silicon dioxide mask structure overlying the gate structure. The device has an epitaxially grown fill material in an etched source region and an etched drain region.

18 Claims, 4 Drawing Sheets

METHOD AND STRUCTURE USING A PURE SILICON DIOXIDE HARDMASK FOR GATE PATTERNING FOR STRAINED SILICON MOS TRANSISTORS

CROSS-REFERENCES TO RELATED APPLICATIONS

This application is a continuation of U.S. patent application Ser. No. 11/245,412 entitled "Method and Structure using a Pure Silicon Dioxide Hardmask for Gate Pattering for Strained Silicon MOS Transistors," filed Oct. 5, 2005; which claims priority to Chinese Patent Application no. 200510029993.6 entitled "Method and Structure using a Pure Silicon Dioxide Hardmask for Gate Pattering for Strained Silicon MOS Transistors," filed Sep. 19, 2005; commonly assigned, incorporated by reference herein for all purposes.

BACKGROUND OF THE INVENTION

The present invention is directed to integrated circuits and their processing for the manufacture of semiconductor devices. More particularly, the invention provides a method and structures for manufacturing MOS devices using strained silicon structures for advanced CMOS integrated circuit devices. But it would be recognized that the invention has a much broader range of applicability.

Integrated circuits have evolved from a handful of interconnected devices fabricated on a single chip of silicon to millions of devices. Conventional integrated circuits provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of integrated circuits.

Increasing circuit density has not only improved the complexity and performance of integrated circuits but has also provided lower cost parts to the consumer. An integrated circuit or chip fabrication facility can cost hundreds of millions, or even billions, of U.S. dollars. Each fabrication facility will have a certain throughput of wafers, and each wafer will have a certain number of integrated circuits on it. Therefore, by making the individual devices of an integrated circuit smaller, more devices may be fabricated on each wafer, thus increasing the output of the fabrication facility. Making devices smaller is very challenging, as each process used in integrated fabrication has a limit. That is to say, a given process typically only works down to a certain feature size, and then either the process or the device layout needs to be changed. Additionally, as devices require faster and faster designs, process limitations exist with certain conventional processes and materials.

An example of such a process is the manufacture of MOS devices itself. Such device has traditionally became smaller and smaller and produced faster switching speeds. Although there have been significant improvements, such device designs still have many limitations. As merely an example, these designs must become smaller and smaller but still provide clear signals for switching, which become more difficult as the device becomes smaller. Additionally, these designs are often difficult to manufacture and generally require complex manufacturing processes and structures. These and other limitations will be described in further detail throughout the present specification and more particularly below.

From the above, it is seen that an improved technique for processing semiconductor devices is desired.

BRIEF SUMMARY OF THE INVENTION

According to the present invention, techniques for processing integrated circuits for the manufacture of semiconductor devices are provided. More particularly, the invention provides a method and structures for manufacturing MOS devices using strained silicon structures for CMOS advanced integrated circuit devices. But it would be recognized that the invention has a much broader range of applicability.

In a specific embodiment, the present invention provides a method for forming a semiconductor integrated circuit device, e.g., CMOS, NMOS. The method includes providing a semiconductor substrate, e.g., silicon wafer, silicon on insulator. The method includes forming a dielectric layer (e.g., oxide, nitride, oxynitride) overlying the semiconductor substrate. The method includes forming a gate layer (e.g., polysilicon) overlying the dielectric layer. Preferably, the gate layer is overlying a channel region in the semiconductor substrate. The method includes forming a substantially pure silicon dioxide hard mask layer overlying the gate layer and patterning the gate layer, including the hard mask layer, to form a gate structure including edges. In a specific embodiment, the pure silicon dioxide hard mask is made of a material that is substantially free from any nitrides or other impurities. The method also includes forming a dielectric layer overlying the gate structure and hard mask layer to protect the gate structure including the edges. The method patterns the dielectric layer to form sidewall spacer structures on the gate structure, including the edges, and exposes a portion of the hard mask layer. The method includes etching a source region and a drain region adjacent to the gate structure using the dielectric layer and portion of the hard mask layer as a protective layer and depositing silicon germanium material into the source region and the drain region to fill the etched source region and the etched drain region. The method includes causing a channel region between the source region and the drain region to be strained in compressive mode from at least the silicon germanium material formed in the source region and the drain region.

In an alternative specific embodiment, the present invention provides a method for forming a semiconductor integrated circuit device, e.g., CMOS, NMOS. The method includes providing a semiconductor substrate, e.g., silicon wafer, silicon on insulator. The method includes forming a dielectric layer (e.g., oxide, nitride, oxynitride) overlying the semiconductor substrate. The method includes forming a gate layer (e.g., polysilicon) overlying the dielectric layer. Preferably, the gate layer is overlying a channel region in the semiconductor substrate. The method includes forming a substantially pure silicon dioxide hard mask overlying the gate layer and patterning the gate layer, including the hard mask layer, to form a gate structure including edges. The method also includes forming a dielectric layer overlying the gate structure and hard mask layer to protect the gate structure including the edges. The method patterns the dielectric layer to form sidewall spacer structures on the gate structure, including the edges, and exposes a portion of the hard mask layer. The method includes etching a source region and a drain region adjacent to the gate structure using the dielectric layer and portion of the metal hard mask layer as a protective layer and depositing silicon germanium material into the source region and the drain region to fill the etched source region and the etched drain region. The method includes causing a channel region between the source region and the drain region to be strained in compressive mode from at least the silicon germanium material formed in the source region and the drain region. The method also selectively removing substantially all of the pure silicon dioxide hard mask without any damage to the gate structure according to a preferred embodiment.

In yet an alternative specific embodiment, the present invention provides a partially completed semiconductor integrated circuit device. The device has a semiconductor substrate and a dielectric layer overlying the semiconductor substrate. The device has a gate structure including edges and a substantially pure silicon dioxide mask structure overlying the gate structure. A thickness ranging from about 400 to about 600 Angstroms of the substantially pure silicon dioxide mask structure is included. The device has a dielectric layer forming sidewall spacers on the edges of the gate structure to protect the gate structure including the edges and an exposed portion of the pure silicon dioxide mask structure overlying the gate structure. The device has a silicon germanium fill material in an etched source region and an etched drain region. Preferably, the etched source region and the etched drain region are coupled to the gate structure. The device has a strained channel region between the filled source region and the filled drain region from at least the silicon germanium material formed in the etched source region and the etched drain region.

In still an alternative specific embodiment, the present invention provides a partially completed semiconductor integrated circuit device. The device has a semiconductor substrate and a dielectric layer overlying the semiconductor substrate. The device has a gate structure including edges and a substantially pure silicon dioxide mask structure overlying the gate structure. A thickness ranging from about 400 to about 600 Angstroms of the substantially pure silicon dioxide mask structure is included. The device has a dielectric layer forming sidewall spacers on the edges of the gate structure to protect the gate structure including the edges and an exposed portion of the pure silicon dioxide mask structure overlying the gate structure. The device has an epitaxially grown fill material (e.g., silicon/germanium, silicon carbide) in an etched source region and an etched drain region. Preferably, the etched source region and the etched drain region are coupled to the gate structure. The device has a strained channel region between the filled source region and the filled drain region from at least the fill material formed in the etched source region and the etched drain region.

In a specific embodiment, the present invention provides a method using a silicon germanium fill material, which has a larger lattice spacing than single crystal silicon material. Such larger lattice spacing of silicon germanium fill material causes a channel region of an MOS transistor to be in a slightly compressive mode, when such material has been deposited in recessed regions adjacent to the channel region. Although the lattice spacing is slightly larger, silicon germanium still grows within the recessed regions, which are substantially single crystal silicon bearing material. Of course, there may be other variations, medications, and alternatives.

Many benefits are achieved by way of the present invention over conventional techniques. For example, the present technique provides an easy to use process that relies upon conventional technology. In some embodiments, the method provides higher device yields in dies per wafer. Additionally, the method provides a process that is compatible with conventional process technology without substantial modifications to conventional equipment and processes. Preferably, the invention provides for an improved process integration for design rules of 65 nanometers and less or 90 nanometers and less. Additionally, the invention provides for increased mobility of holes using a strained silicon structure for CMOS devices. Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow.

DETAILED DESCRIPTION OF THE INVENTION

According to the present invention, techniques for processing integrated circuits for the manufacture of semiconductor devices are provided. More particularly, the invention provides a method and structures for manufacturing MOS devices using strained silicon structures for CMOS advanced integrated circuit devices. But it would be recognized that the invention has a much broader range of applicability.

Figure 1:
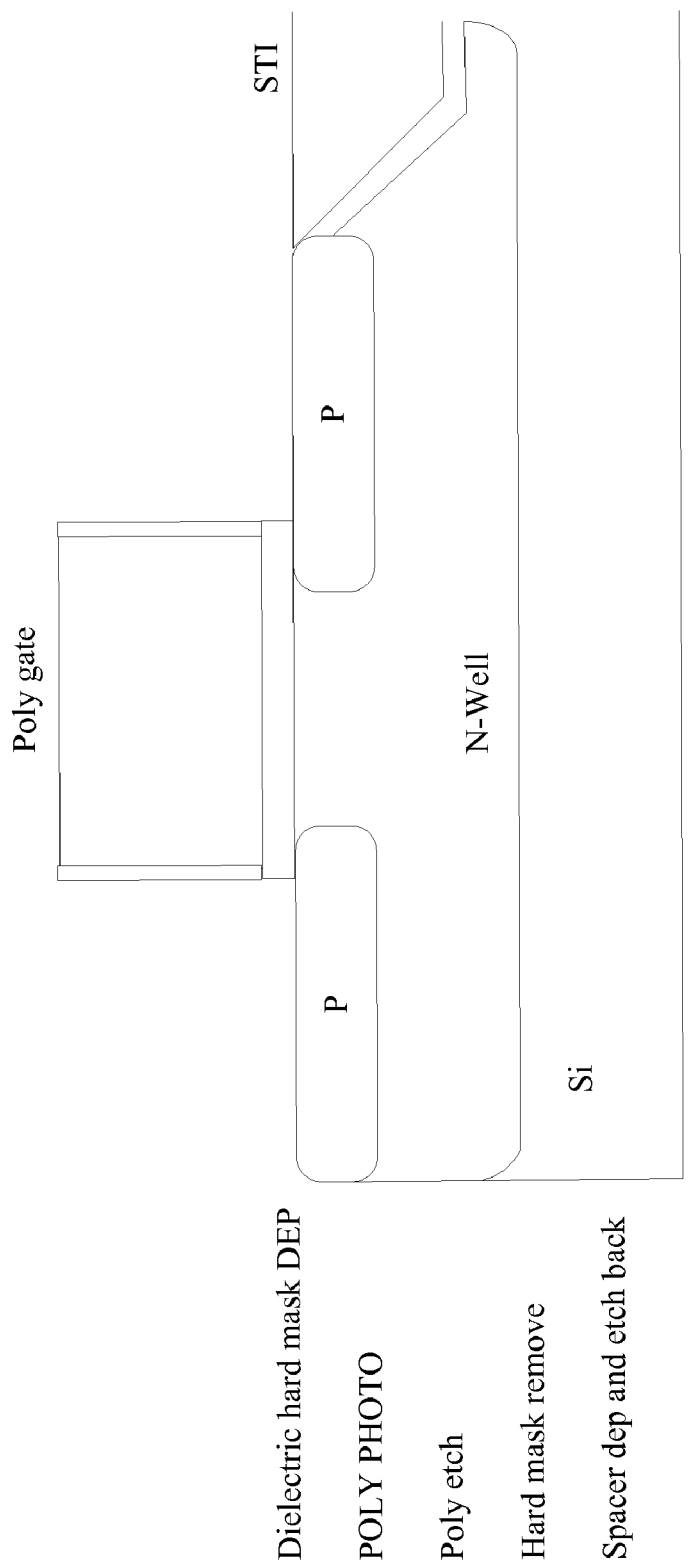
FIG. 1 is a simplified cross-sectional view diagram illustrating a conventional NMOS device.

FIG. 1 is simplified cross-sectional view diagram of a conventional NMOS device. Referring to FIG. 1, a conventional process sequence has been reproduced below.

1. Provide a silicon substrate;
2. Form gate layer;
3. Form dielectric hard mask;
4. Pattern dielectric mask;
5. Pattern gate layer to form polysilicon gates;
6. Remove hard mask;
7. Deposit spacer layer and etch back; and
8. Perform other steps as desired.

As shown, the hard mask is removed before spacer formation, which are not suitable for fabricating strained silicon NMOS devices. That is, limitations exist with the conventional hard mask. Added resistivity may exist from any remaining dielectric residues on the gate layer. Additionally, residual silicon/germanium may deposit on any exposed surfaces of the gate layer, depending upon the quality of the hard mask. The conventional mask also has poor selectivity when etching recessed regions for silicon germanium regions. These and other limitations may be overcome by the present method and structures, which will be described in more detail below.

Figure 2:
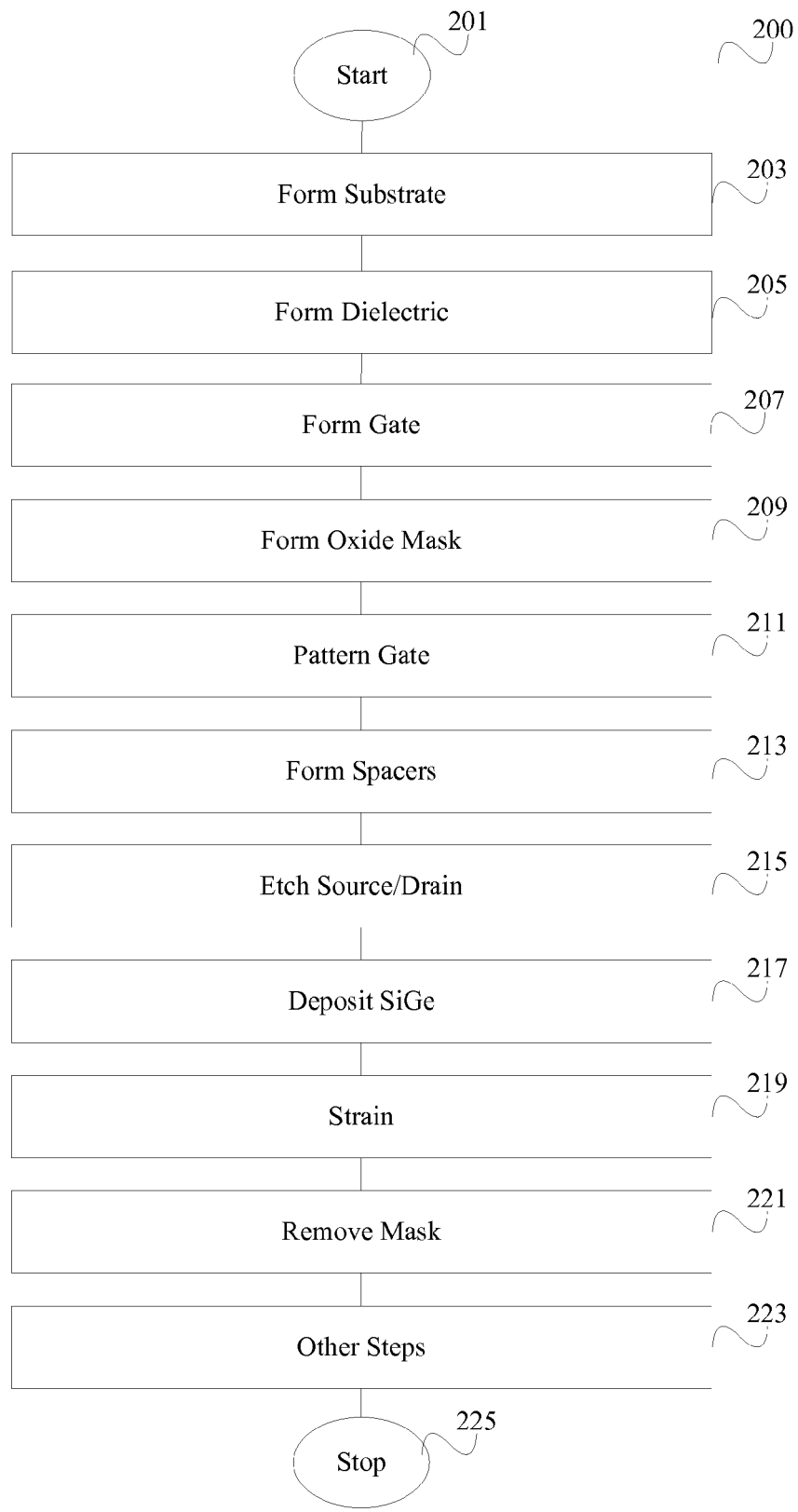
FIG. 2 is a simplified flow diagram illustrating a method for fabricating a strained silicon MOS device according to an embodiment of the present invention.

A method for fabricating an integrated circuit device according to an embodiment of the present invention may be outlined as follows (see, FIG. 2):

1. Provide a semiconductor substrate (step 203), e.g., silicon wafer, silicon on insulator after shut, step 201;
2. Form a dielectric layer (step 205) (e.g., gate oxide or nitride) overlying the semiconductor substrate;
3. Form a gate layer (step 207) (e.g., polysilicon, metal) overlying the dielectric layer;
4. Form a substantially pure silicon dioxide mask layer (step 209) overlying the dielectric layer;

5. Pattern the gate layer (step 211), including the metal hard mask layer, to form a gate structure including edges (e.g., a plurality of sides or edges);
6. Form a dielectric layer overlying the gate structure to protect the gate structure including the edges;
7. Pattern the dielectric layer to form sidewall spacers (step 213) on edges of the gate structure;
8. Optionally, expose a portion of the hard mask layer during the pattern of the dielectric layer;
9. Etch the source region and the drain region (step 215) adjacent to the gate structure using the dielectric layer and hard mask as the protective layer;
10. Deposit silicon germanium material (step 217) into the source region and the drain region to fill the etched source region and the etched drain region;
11. Cause a channel region between the source region and the drain region to be strained (step 219) in compressive mode from at least the silicon germanium material formed in the source region and the drain region, wherein the channel region is about the same width as the patterned gate layer;
12. Selectively remove (step 221) the hard mask using a selective etching species; and
13. Perform other steps (step 223), as desired, or stop, (step 225).

The above sequence of steps provides a method according to an embodiment of the present invention. As shown, the method uses a combination of steps including a way of forming an integrated circuit device such as an N-type channel device for a CMOS integrated circuit. As shown, the method includes using a substantially pure silicon dioxide hard mask as a protective layer for forming the etched source/drain regions. Other alternatives can also be provided where steps are added, one or more steps are removed, or one or more steps are provided in a different sequence without departing from the scope of the claims herein. Further details of the present method can be found throughout the present specification and more particularly below.

A method for fabricating a CMOS integrated circuit device according to an alternative embodiment of the present invention may be outlined as follows:
1. Provide a semiconductor substrate, e.g., silicon wafer, silicon on insulator;
2. Form a gate dielectric layer overlying the surface of the substrate;
3. Form a gate layer overlying the semiconductor substrate;
4. Form a substantially pure silicon dioxide hard mask layer overlying the gate layer;
5. Pattern the gate layer, including the hard mask layer, to form an NMOS gate structure including edges and a PMOS gate structure including edges;
6. Form a dielectric layer overlying the NMOS gate structure to protect the NMOS gate structure including the edges and overlying the PMOS gate structure to protect the PMOS gate structure including the edges;
7. Form sidewall spacers on edges of the gate structures from the dielectric layer;
8. Optionally, expose a portion of the hard mask layer on the gate structures;
9. Simultaneously etch a first source region and a first drain region adjacent to the NMOS gate structure and etch a second source region and a second drain region adjacent to the PMOS gate structure using the dielectric layer and exposed portion of the hard mask layer as a protective layer;
10. Pretreat etched source/drain regions;
11. Mask NMOS regions;
12. Deposit silicon germanium material into the first source region and the first drain region to cause a channel region between the first source region and the first drain region of the PMOS gate structure to be strained in a compressive mode;
13. Strip Mask from NMOS regions;
14. Mask PMOS regions;
15. Deposit silicon carbide material into the second source region and second drain region to cause the channel region between the second source region and the second drain region of the NMOS gate structure to be strained in a tensile mode; and
16. Selectively remove the hard mask using a selective etching species; and
17. Perform other steps, as desired.

The above sequence of steps provides a method according to an embodiment of the present invention. As shown, the method uses a combination of steps including a way of forming a CMOS integrated circuit device. As shown, the method includes using a substantially pure silicon dioxide hard mask as a protective layer for forming the etched source/drain regions. Other alternatives can also be provided where steps are added, one or more steps are removed, or one or more steps are provided in a different sequence without departing from the scope of the claims herein. Further details of the present device can be found throughout the present specification and more particularly below.

Figure 3:
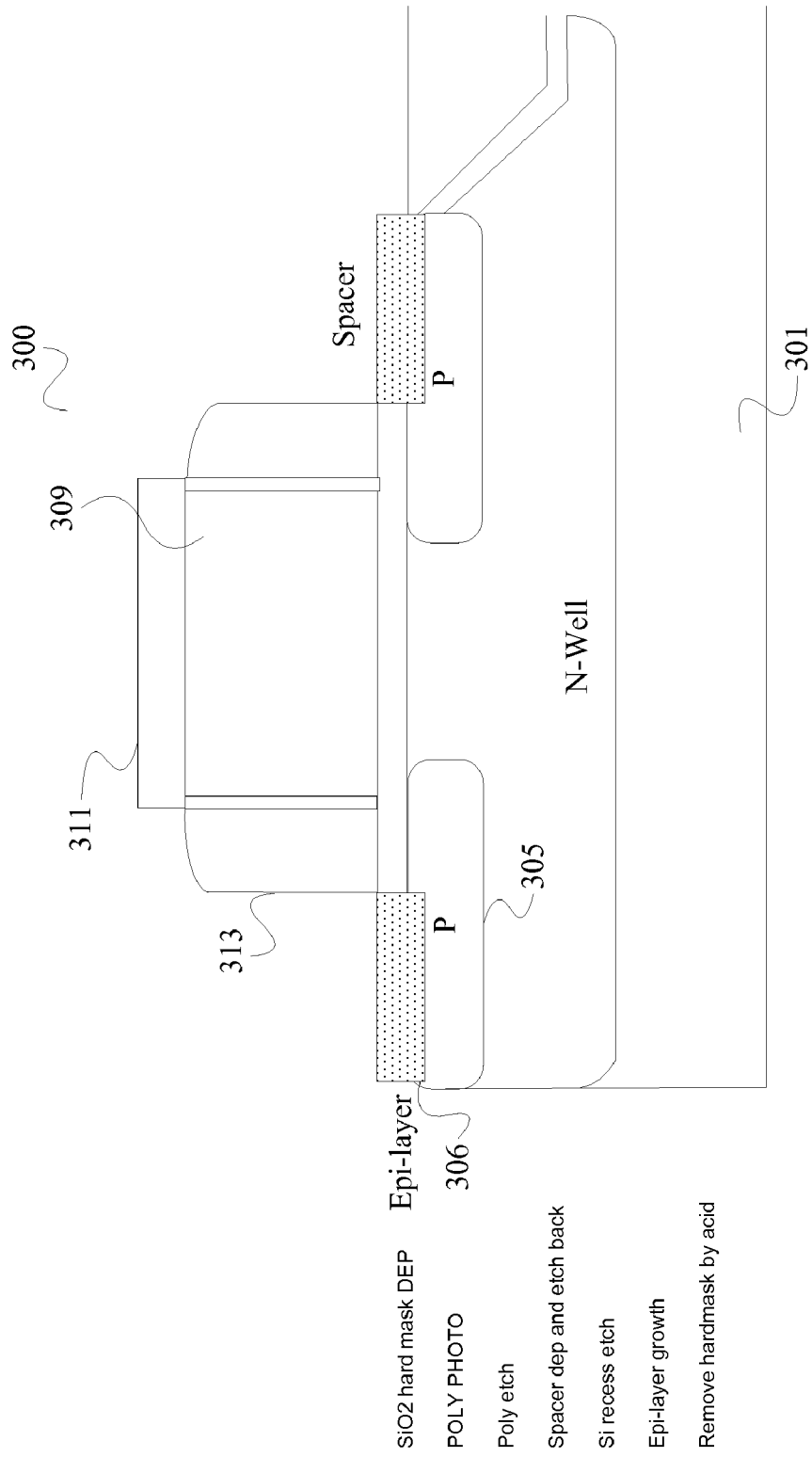
FIG. 3 is a simplified cross-sectional view diagram of a strained silicon MOS device according to an embodiment of the present invention.
Figure 4:
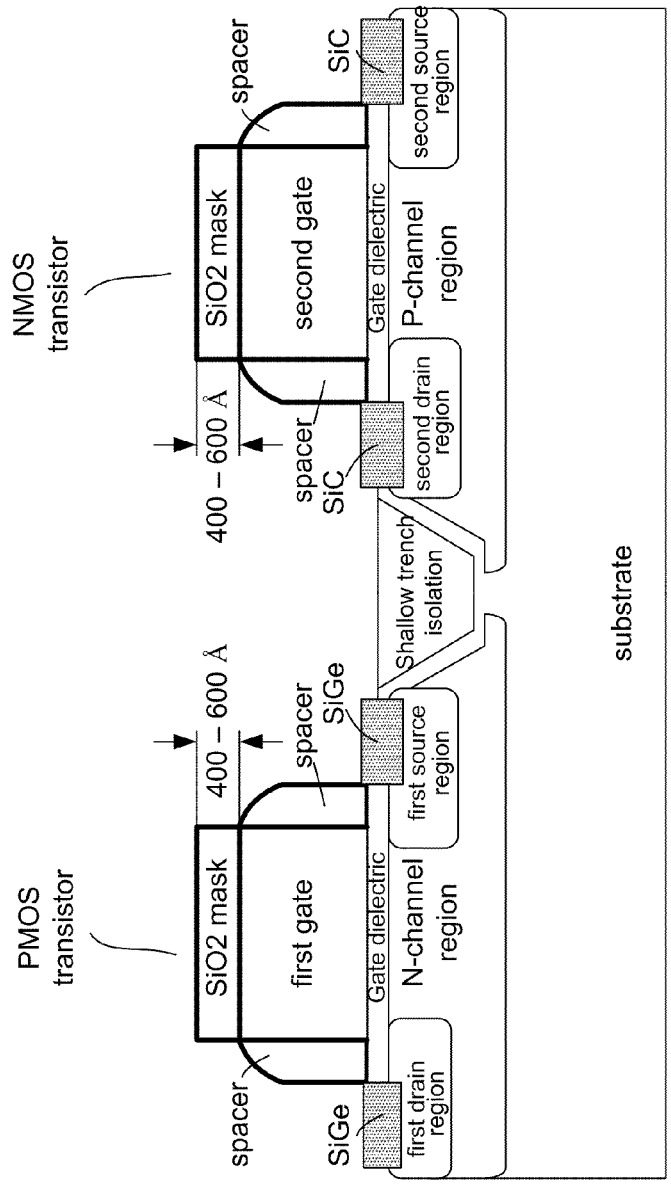
FIG. 4 is a simplified cross-sectional view diagram of a CMOS device according to an embodiment of the present invention.

FIG. 3 is a simplified cross-sectional view diagram of a strained silicon MOS device 300 according to an embodiment of the present invention. This diagrams are merely examples, which should not unduly limit the scope of the claims herein. One of ordinary skill in the art would recognize many variations, alternatives, and modifications. As shown, the present invention provides a semiconductor integrated circuit device. The device has a semiconductor substrate 301, e.g., silicon wafer, silicon on insulator wafer. The device has a dielectric layer overlying the semiconductor substrate. Preferably, the dielectric acts as a gate dielectric layer and is made of silicon dioxide, silicon nitride, or silicon oxynitride depending upon the specific embodiment. The device is formed in well region 503, which is an N-type well. Other wells may be P-type to form CMOS devices.

The device also has a gate structure 309 including edges. The gate structure is often made of a polysilicon material that is doped with impurities. The polysilicon material can be in-situ doped using boron type impurities or others. The gate structure can be a single layer or multiple layers depending upon the embodiment. In a preferred embodiment, a substantially pure silicon dioxide hard mask layer 311 is overlying the gate structure. In a specific embodiment, the hard mask is formed from a substantially pure silicon dioxide material that is free from any nitrides or other impurities. In a specific embodiment, the hard mask has a thickness of about 400 to about 600 Angstroms, which is suitable for fabrication of devices having a channel length of 65 nanometers and less. In a preferred embodiment, the hard mask has an etching selectivity to silicon greater of 1:30 or 1:70 according to certain embodiments. Depending upon the embodiment, the hard mask preferably remains on the gate structure from forming it on the gate structure to a process after the silicon germanium deposition process, which will be described in greater detail below.

In a specific embodiment, a dielectric layer forms sidewall spacers 313 on the edges of the gate structure to protect the gate structure including the edges. The dielectric layer can be an oxide, a nitride, or other suitable materials of sufficient thickness. The dielectric layer is also substantially pinhole free according to preferred embodiments. The dielectric layer is preferably less than 300 Angstroms in preferred embodiments. As shown, the device also has an exposed portion of the metal hard mask layer overlying the gate structure.

In a specific embodiment, a silicon germanium fill material 306 is provided in an etched source region and an etched drain region. The silicon germanium fill material is single crystalline and deposited using an epitaxial reactor. The ratio of silicon/germanium is 10% to 30% according to a specific embodiment. The etched source region and the etched drain region are each coupled to the gate structure. The device has a strained channel region between the filled source region and the filled drain region from at least the silicon germanium material formed in the etched source region and the etched drain region. The device also has lightly doped drain regions or implant regions 305, which are formed before growing the silicon/germanium material in the recessed regions. once the hard mask has been cleared, the device has a metal layer overlying the gate structure according to a specific embodiment. Of course, there can be other variations, modifications, and alternatives.

In preferred embodiments, the hard mask is selectively removed without causing damage to the underlying gate structure. Preferably, the gate structure is made of polysilicon material, which has been doped with an impurity. The gate structure is substantially free from any damage caused from etching and/or removal of the hard mask according to preferred embodiments. The selective removal occurs using a highly selective etchant such as hydrogen fluoride bearing species, and others. Of course, one of ordinary skill in the art would recognize many variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A partially completed semiconductor integrated circuit device comprising:
    a semiconductor substrate;
    a dielectric layer overlying the semiconductor substrate;
    a gate structure including edges;
    a substantially pure silicon dioxide mask structure overlying a top surface region of the gate structure, the substantially pure silicon dioxide mask structure having an etching selectivity to silicon of greater than 1:30;
    a thickness ranging from about 400 Angstroms to about 600 Angstroms of the substantially pure silicon dioxide mask structure;
    a dielectric layer forming sidewall spacers on the edges of the gate structure to protect the edges of the gate structure;
    a silicon germanium fill material in an etched source region and an etched drain region, the etched source region and the etched drain region being coupled to the gate structure; and
    a strained channel region between a filled source region and a filled drain region from at least the silicon germanium material formed in the etched source region and the etched drain region.

2. The device of claim 1 wherein the dielectric layer overlying the semiconductor substrate is less than 300 Angstrom.

3. The device of claim 1 wherein the strained channel region comprises a length that is equal to a width of the gate structure.

4. A partially completed CMOS semiconductor integrated circuit device comprising:
    a semiconductor substrate;
    a dielectric layer overlying the semiconductor substrate;
    a gate structure including edges overlying the dielectric layer;
    a substantially pure silicon dioxide mask structure overlying the gate structure, the substantially pure silicon dioxide mask structure having an etching selectivity to silicon of greater than 1:30;
    a thickness ranging from about 400 Angstroms to about 600 Angstroms of the substantially pure silicon dioxide mask structure;
    a dielectric layer forming sidewall spacers on the edges of the gate structure to protect the gate structure including the edges;
    an epitaxially grown fill material in an etched source region and an etched drain region, the etched source region and the etched drain region being coupled to the gate structure; and
    a strained channel region between a filled source region and a filled drain region from at least the epitaxially grown fill material formed in the etched source region and the etched drain region.

5. The device of claim 4 wherein the epitaxially grown fill material comprises silicon germanium material.

6. The device of claim 4 wherein the strained channel region comprises a length that is equal to a width of the gate structure.

7. A partially completed semiconductor integrated circuit device comprising:
    a semiconductor substrate;
    a dielectric layer overlying the semiconductor substrate;
    a first gate structure including edges and a second gate structure including edges;
    a substantially pure silicon dioxide mask structure overlying the first and second gate structures, the pure silicon dioxide being substantially free from any nitride bearing species, the substantially pure silicon dioxide mask structure having an etching selectivity to silicon of greater than 1:30;
    a thickness ranging from about 400 Angstroms to about 600 Angstroms of the substantially pure silicon dioxide mask structure;
    a dielectric layer forming sidewall spacers on the edges of the gate structures to protect the gate structures including the edges, the dielectric layer exposing a portion of the silicon dioxide mask;
    a pure silicon dioxide mask structure overlying a portion of the gate structures, the portion being a top surface region of the gate structure;
    a silicon germanium fill material in an etched first source region and an etched first drain region, the first source region and the first drain region being adjacent to the first gate structure;
    a strained N-type channel region between the first source region and the first drain region from at least the silicon germanium material formed in the etched first source region and the first etched drain region; and
    a P-type channel region between a second source region and a second drain region; the second source region and the second drain region being adjacent to the second gate structure.

8. The device of claim 7 further comprising a silicon carbide material filled into at least the second source region and the second drain region.

9. The device of claim 8 wherein the second source region and the second drain region strain the P-type channel region in tensile mode.

10. The device of claim 7 wherein the first source region and the first drain region strain the N-type channel region in compressive mode.

11. The device of claim 10 wherein the compressive mode increases a mobility of holes in the strained N-type channel region.

12. The device of claim 7 wherein the first gate is being covered with a masking material.

13. The device of claim 7 wherein the strained N-type channel region has a length of a width of the gate structure.

14. The device of claim 7 wherein the semiconductor substrate is essential silicon material.

15. The device of claim 7 wherein the dielectric layer overlying the semiconductor substrate is less than 300 Angstrom.

16. The device of claim 7 wherein the silicon germanium material is single crystalline.

17. The device of claim 7 wherein the silicon germanium has a ratio of silicon/germanium of 10% to 30%.

18. The device of claim 7 further comprising a contact structure on a metal hard mask, the metal hard mask being in physical and electrical contact with the first gate structure.

* * * * *